US008836428B2

(12) United States Patent
Liu (10) Patent No.: US 8,836,428 B2
(45) Date of Patent: Sep. 16, 2014

(54) OPERATIONAL AMPLIFIER HAVING LOW POWER CONSUMPTION

(71) Applicant: Sitronix Technology Corp., Hsinchu County (TW)

(72) Inventor: Ping-Lin Liu, Hsinchu County (TW)

(73) Assignee: Sitronix Technology Corp., Hsinchu (TW)

( * ) Notice: Subject to any disclaimer, the term of this patent is extended or adjusted under 35 U.S.C. 154(b) by 0 days.

(21) Appl. No.: 13/669,518

(22) Filed: Nov. 6, 2012

(65) Prior Publication Data

US 2013/0127533 A1    May 23, 2013

(30) Foreign Application Priority Data

Nov. 23, 2011   (TW) .............................. 100143017 A (51) Int. Cl.
*H03F 3/45*    (2006.01)
*H03F 1/02*    (2006.01)

(52) U.S. Cl.
CPC ........ *H03F 3/45076* (2013.01); *H03F 3/45183* (2013.01); *H03F 1/0261* (2013.01); *H03F 2203/45626* (2013.01); *H03F 2203/45674* (2013.01)
USPC .......................................... 330/254; 330/261

(58) Field of Classification Search
USPC ................................................ 330/252–261
See application file for complete search history.

(56) References Cited

U.S. PATENT DOCUMENTS

| 7,551,030 B2 * | 6/2009 | An et al. ...................... 330/255 |
| 2009/0231319 A1 | 9/2009 | Tsuchi |
| 2013/0088473 A1 * | 4/2013 | Tsuchi ........................... 345/211 |

FOREIGN PATENT DOCUMENTS

JP         2009-218958 A    9/2009

OTHER PUBLICATIONS

Communication From the Taiwan Patent Office Regarding a Counterpart Foreign Application Dated (Taiwan Year 103) 2014-05-26 Citing JP2009-218958.

* cited by examiner

*Primary Examiner* — Hieu Nguyen
(74) *Attorney, Agent, or Firm* — Rosenberg, Klein & Lee (57) ABSTRACT

The present invention relates to an operational amplifier having low power consumption, which comprises a differential circuit, an output-stage circuit, and a floating bias generating circuit. The differential circuit receives an input signal and produces a control signal. The output-stage circuit is coupled to the differential circuit and produces an output signal according to the control signal. The floating bias generating circuit is coupled between the differential circuit and the output-stage circuit and generates a floating bias according to the control signal for controlling the rising or lowering of the voltage level of the output signal. Accordingly, the operational amplifier can charge and discharge rapidly, and thus extending the applications of the operational amplifier. Besides, the floating bias generating circuit can limit the output current while the operational amplifier is driving, and thus achieving the purpose of low power consumption.

8 Claims, 11 Drawing Sheets

OPERATIONAL AMPLIFIER HAVING LOW POWER CONSUMPTION

FIELD OF THE INVENTION

The present invention relates generally to an operational amplifier, and particularly to an operational amplifier having low power consumption.

BACKGROUND OF THE INVENTION

Modern technologies are developing prosperously. Novel information products are introduced daily for satisfying people's various needs. Early displays are mainly cathode ray tubes (CRTs). Owing to their huge size, heavy power consumption, and radiation hazardous to the heath of long-term users, traditional CRTs are gradually replaced by liquid crystal displays (LCDs). LCDs have the advantages of small size, low radiation, and low power consumption, and thus becoming the mainstream in the market.

An LCD is a kind of flat panel display (FPD) with slim and light appearance and the advantages of low radiation, small size, and low power consumption. It has been replacing traditional CRT and is applied extensively to information products such as notebook computers, personal digital assistants (PDAs), flat TVs, or mobile phones. An LCD comprises liquid crystal panel, a timing controller (TCON), a gate driver, and a source driver. The timing controller is used for producing image data signals as well as driving the control signal and the timing signal required by the liquid crystal panel. The gate driver is used for producing the scan signals for turning the pixel circuit array on or off. Besides, the source driver is used for producing the driving signals of the liquid crystal panel according to the image data signals, the control signal, and the timing signal.

The driver chips of modern liquid crystal panels are developing towards high resolution; each stage of sources is output by an operational amplifier for driving the load. Because the higher the resolution, the more the operational amplifiers are required, the operational amplifiers will produce a substantial static current. For solving this problem, the only method is to limit the static operating current of the operational amplifiers to a very small range. Nonetheless, the operational amplifier according to the prior art adopts the method of floating source follower to control the output static current. The operational amplifier of this architecture tends to be influenced by the variations of the fabrication process and leading to excessive static current at the output stage, which results in excessive static power consumption.

Accordingly, the present invention provides a novel operational amplifier, which can reduce the power consumption and solve the problem described above.

SUMMARY

An objective of the present invention is to provide an operational amplifier having low power consumption, which uses a floating bias generating circuit located between a differential circuit and an output-stage circuit. A floating voltage is generated according to a control signal for controlling the rising or lowering of the voltage level of an output signal of the output-stage circuit. Thereby, the operational amplifier can charge and discharge rapidly, and thus extending the applications of the operational amplifier.

Another objective of the present invention is to provide an operational amplifier having low power consumption, which uses a floating bias generating circuit to limit the output current while the operational amplifier is driving, and thus achieving the purpose of low power consumption.

The operational amplifier having low power consumption according to the present invention comprises a differential circuit, an output-stage circuit, and a floating bias generating circuit. The differential circuit receives an input signal and produces a control signal. The output-stage circuit is coupled to the differential circuit and produces an output signal according to the control signal. The floating bias generating circuit is coupled between the differential circuit and the output-stage circuit and generates a floating bias according to the control signal for controlling the rising or lowering of the voltage level of the output signal. Thereby, by using the floating bias generating circuit located between the differential circuit and the output-stage circuit, the floating voltage is generated according to the control signal for controlling the rising or lowering of the voltage level of the output signal of the output-stage circuit. Accordingly, the operational amplifier can charge and discharge rapidly, and thus extending the applications of the operational amplifier. Besides, the floating bias generating circuit can limit the output current while the operational amplifier is driving, and thus achieving the purpose of low power consumption.

DETAILED DESCRIPTION

In order to make the structure and characteristics as well as the effectiveness of the present invention to be further understood and recognized, the detailed description of the present invention is provided as follows along with embodiments and accompanying figures.

Figure 1:
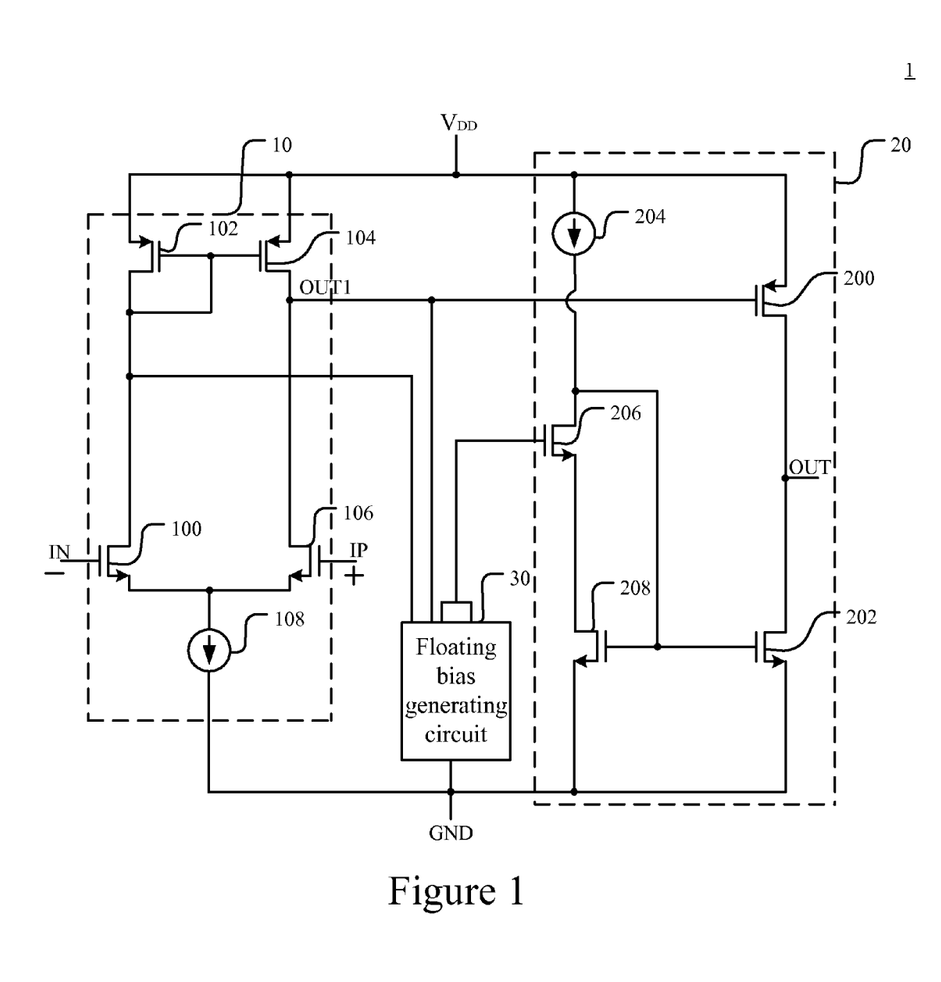
FIG. 1 shows a circuit diagram of the operational amplifier according to an embodiment of the present invention.

FIG. 1 shows a circuit diagram of the operational amplifier according to an embodiment of the present invention. As shown in the figure, the operational amplifier having low power consumption according to the present invention comprises a differential circuit 10, an output-stage circuit 20, and a floating bias generating circuit 30. The differential circuit 10 receives an input signal from the inputs IN, IP and produces a control signal. The output-stage circuit 20 is coupled to the differential circuit 10 and produces an output signal according to the control signal. The differential circuit 20 will control the rising or lowering of the voltage level of the output signal according to the loading status, and thereby controlling the operational amplifier 1 to drive high or to drive low.

A general operational amplifier can only charge or discharge the load. In other words, a general operational is either good at charging or discharging the load. The rising in the voltage level of the output signal of the output-stage circuit 20 charges the load. On the contrary, the lowering in the voltage level of the output signal of the output-stage circuit 20 discharges the load. Thereby, in order that the operational amplifier 1 according to the present invention owns both the charging and discharging capabilities on the load, the floating bias generating circuit 30 is added. The floating bias generating circuit 30 is coupled between the differential circuit 10 and the output-stage circuit 20. It generates a floating voltage according to the control signal for controlling the rising or lowering of the voltage level of the output signal. Because the differential circuit 10 will control the voltage level of the output signal of the output-stage circuit 20 according to the loading status, the floating bias generating circuit 30 can know either charging or discharging is required for the load according to the control signal and thus producing the floating voltage for controlling the rising or lowering of the voltage level of the output signal. Hence, by using the floating bias generating circuit 30, the floating voltage is generated according to the control signal of the differential circuit 10 for controlling the rising or lowering of the voltage level of the output signal of the output-stage circuit 20. Accordingly, the operational amplifier can charge and discharge rapidly, and thus extending the applications of the operational amplifier.

Figure 2:
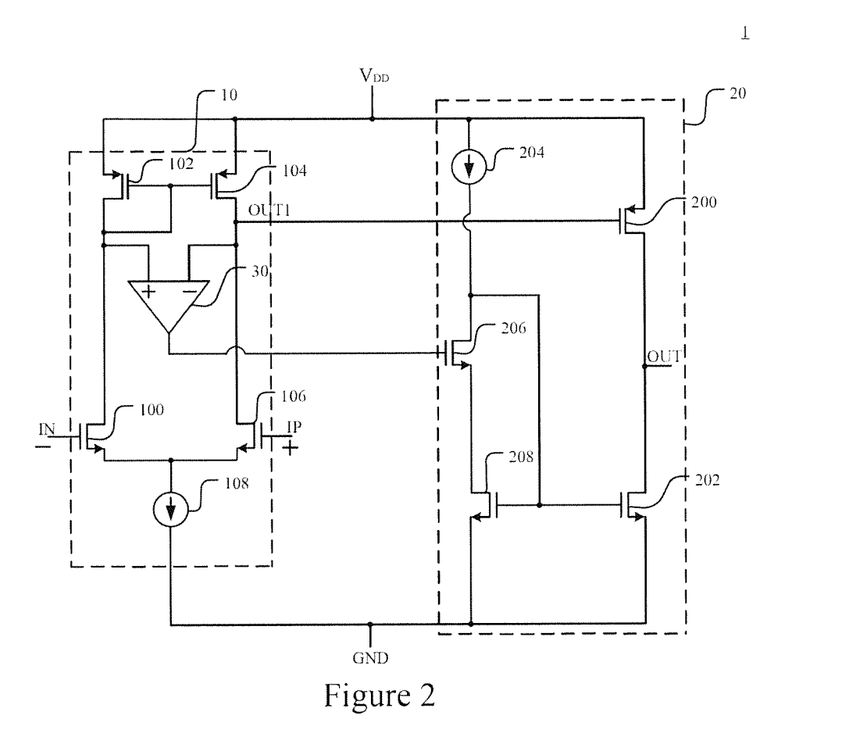
FIG. 2 shows a circuit diagram of the operational amplifier according to another embodiment of the present invention.

FIG. 2 shows a circuit diagram of the operational amplifier according to another embodiment of the present invention. As shown in the figure, the difference between the present embodiment and the one in FIG. 1 is that the floating bias generating circuit 30 according to the present embodiment is an operational amplifying unit 30. The operational amplifying unit 30 is coupled between the differential circuit 10 and the output-stage circuit 20, and generates the floating voltage according to the control signal for controlling the rising or lowering of the voltage level of the output signal. In the following, the detailed circuit of the operational amplifier 1 according to the present invention will be described. First, the differential circuit 10 comprises a first transistor 100, a second transistor 102, a third transistor 104, a fourth transistor 106, and a first current source 108. The first transistor 100 has a gate, a drain, and a source. The gate of the first transistor 100 receives the input signal. According to the present embodiment, the input signal is the signal of an output OUT1 (not shown in the figure) of the differential circuit 10. A terminal of the second transistor 102 is coupled to the first transistor 100, while the other terminal thereof is coupled to a power supply $V_{DD}$. Namely, the second transistor 102 has a gate, a drain, and a source. The drain of the second transistor 102 is coupled to the drain of the first transistor 100; the source of the second transistor 102 is coupled to the power supply $V_{DD}$; and the gate of the second transistor 102 is coupled to the drain of the second transistor 102.

A terminal of the third transistor 104 is coupled to the power supply $V_{DD}$, while the other terminal thereof is coupled to the fourth transistor 106. Namely, the third transistor 104 has a gate, a drain, and a source. The source of the third transistor 104 is coupled to the power supply $V_{DD}$; and the gate of the third transistor 104 is coupled to the gate of the second transistor 102. A terminal of the fourth transistor 106 is coupled to third transistor 104 and the input signal. Namely, the fourth transistor 106 has a gate, a drain, and a source. The drain of the fourth transistor 106 is coupled to the drain of the third transistor 104; the source of the fourth transistor 106 is coupled to the source of the first transistor 100; and the gate of the fourth transistor 106 receives the input signal. According to the present embodiment, the gate of the first transistor 100 and the gate of the fourth transistor 106 are a negative input and a positive input of the differential circuit 10, respectively. A terminal of the first current source 108 is coupled to the first and fourth transistors 100, 106, while the other terminal of the first current source 108 is coupled to a ground GND.

The output-stage circuit 20 according to the present invention comprises a fifth transistor 200 and a sixth transistor 202. The fifth transistor 200 is coupled to and controlled by the control signal. Namely, the fifth transistor 200 has a gate, a drain, and a source. The source of the fifth transistor 200 is coupled to the power supply $V_{DD}$; the drain of the fifth transistor 200 is coupled to the output of the operational amplifier 1; and the gate of the fifth transistor 200 receives the control signal of the differential circuit 10. The sixth transistor 202 is coupled to the fifth transistor 200 and the floating bias generating circuit 30. Namely, the sixth transistor 202 has a gate, a drain, and a source. The drain of the sixth transistor 202 is coupled to the fifth transistor 200 and the output of the operational amplifier 1; the source of the sixth transistor 202 is coupled to the ground GND; and the gate of the sixth transistor 202 rises or lowers the voltage level of the output signal according to the floating bias generated by the floating bias generating circuit 30 for charging or discharging the load.

In addition, for matching the operational amplifier 1 having rapid charging and discharging capability, the output-stage circuit 20 further comprises a second current source 204 and a first control switch 206, and a seventh transistor 208. A terminal of the second current source 204 is coupled to the power supply $V_{DD}$ for providing a bias current $I_{bias}$. The first control switch 206 is coupled to the second current source 204 and controlled by floating bias generated by the floating bias generating circuit 30, so that the bias current $I_{bias}$ controls the rising or lowering of the voltage level of the output signal. The seventh transistor 208 has a gate, a drain, and a source. The drain of the seventh transistor 208 is coupled to a terminal of the first control switch 206; the source of the seventh transistor 208 is coupled to the ground GND; and the gate of the seventh transistor 208 is coupled to the sixth transistor 202 and the other terminal of the first control switch 206. When the first control switch 206 is turned on, the seventh and the sixth transistors 208, 202 form a current-mirror circuit. Thereby, the current produced by the current-mirror circuit can control the output signal of the operational amplifier 1. Besides, the current produced by the current-mirror circuit varies according to the floating voltage generated by the floating bias generating circuit 30. Because the floating voltage generated by the floating bias generating circuit 30 varies according to the control signal, the floating voltage generated by the floating bias generating circuit 30 can control the rising or lowering of the voltage level of the output signal of the output-stage circuit 20 according to the control signal. Accordingly, the operational amplifier can charge and discharge rapidly, and thus extending the applications of the operational amplifier.

Figure 3:
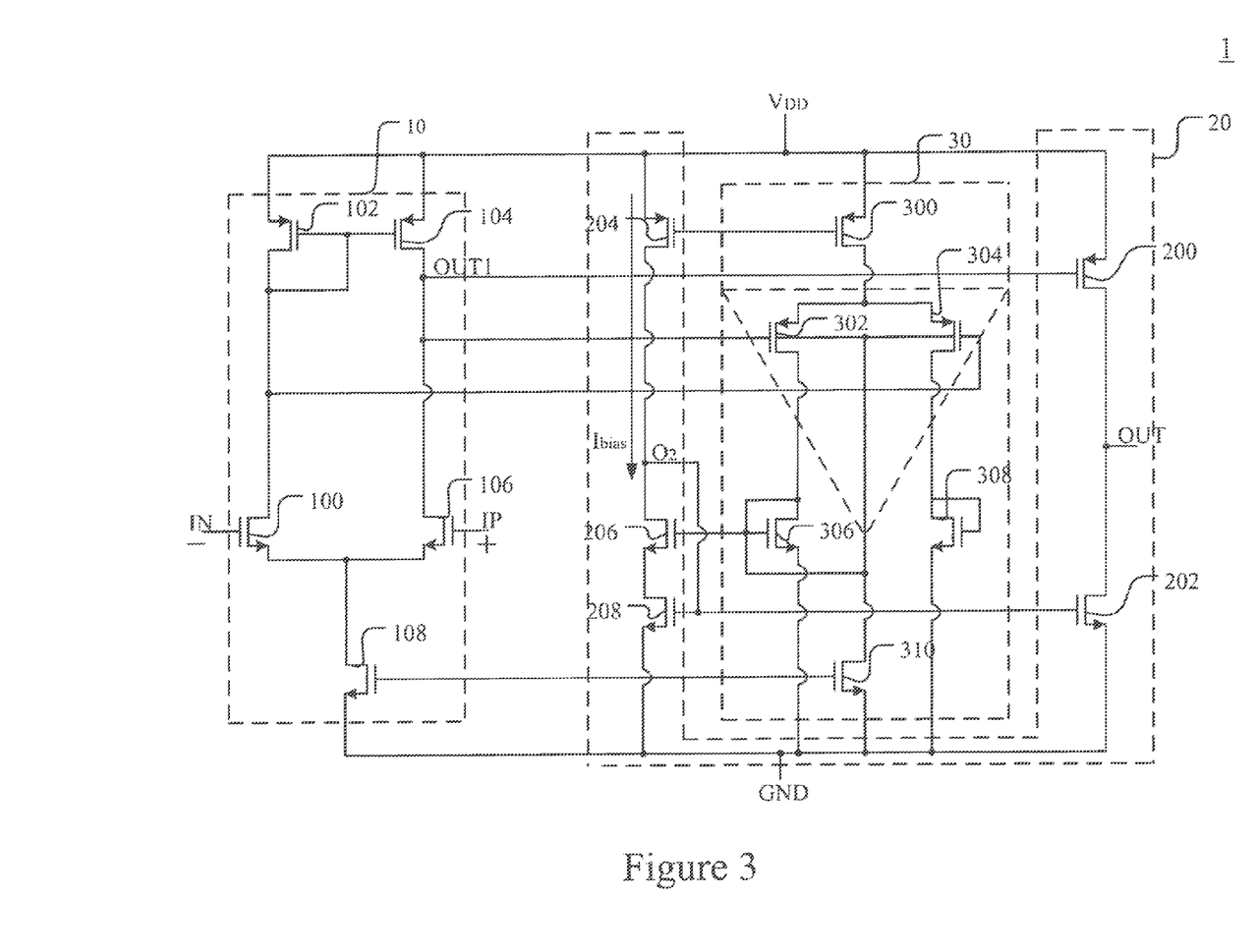
FIG. 3 shows a detailed circuit diagram of the operational amplifier in FIG. 2.

FIG. 3 shows a detailed circuit diagram of the operational amplifier in FIG. 2. As shown in the figure, the floating bias generating circuit 30 according to the present invention is an operational amplifying unit. The floating bias generating circuit 30 comprises a third current source 300, an eighth transistor 302, a ninth transistor 304, a first diode 306, and a second diode 308. A terminal of the third current source 204 is coupled to the power supply $V_{DD}$ for supplying a current. A terminal of the eighth transistor 302 is coupled to the third current source 300. The gate of the eighth transistor 302 is coupled to the output of the differential circuit 10. A terminal of the ninth transistor 304 is coupled to the third current source 300. Namely, the source of the ninth transistor 304 is coupled to the third current source 300 and the source of the eighth transistor 302. The gate of the ninth transistor 304 is coupled between the first and second transistors 100, 102 of the differential circuit 10. A terminal of the first diode 306 is coupled to the eighth transistor 302, while the other terminal of the first diode 306 is coupled to the ground GND. A terminal of the second diode 308 is coupled to the ninth transistor 304, while the other terminal of the second diode 308 is coupled to the ground GND. The first and second diodes 306, 308 are field-effect transistors.

Moreover, the floating bias generating circuit 30 according to the present invention further comprises a fourth current source 310. A terminal of the fourth current source 310 is coupled to the body of the eighth transistor 302 and the body of the ninth transistor 304. The other terminal of the fourth current source 310 is coupled to the ground GND. Thereby, by coupling the fourth current source 310 to the body of the eighth transistor 302 and the body of the ninth transistor 304, the threshold voltages $V_{TH}$ of the eighth transistor 302 and the ninth transistor 304 are lowered, preventing false actions of the floating bias generating circuit 30. For example, if the gate voltages of the eighth transistor 302 and the ninth transistor 304 are 4 volts, the source voltages of the eighth transistor 302 and the ninth transistor 304 must exceed 4.8 volts for turning on the eighth and the ninth transistors 302, 304. Accordingly, by coupling the fourth current source 310 to the body of the eighth transistor 302 and the body of the ninth transistor 304, the threshold voltages $V_{TH}$ of the eighth transistor 302 and the ninth transistor 304 are lowered. When the source voltages of the eighth and the ninth transistors 302, 304 are less than 4.8 volts, the eighth and the ninth transistors 302, 304 can operate normally. Hence, the power consumption is reduced and false actions of the operational amplifying unit can be prevented.

Figure 4A:
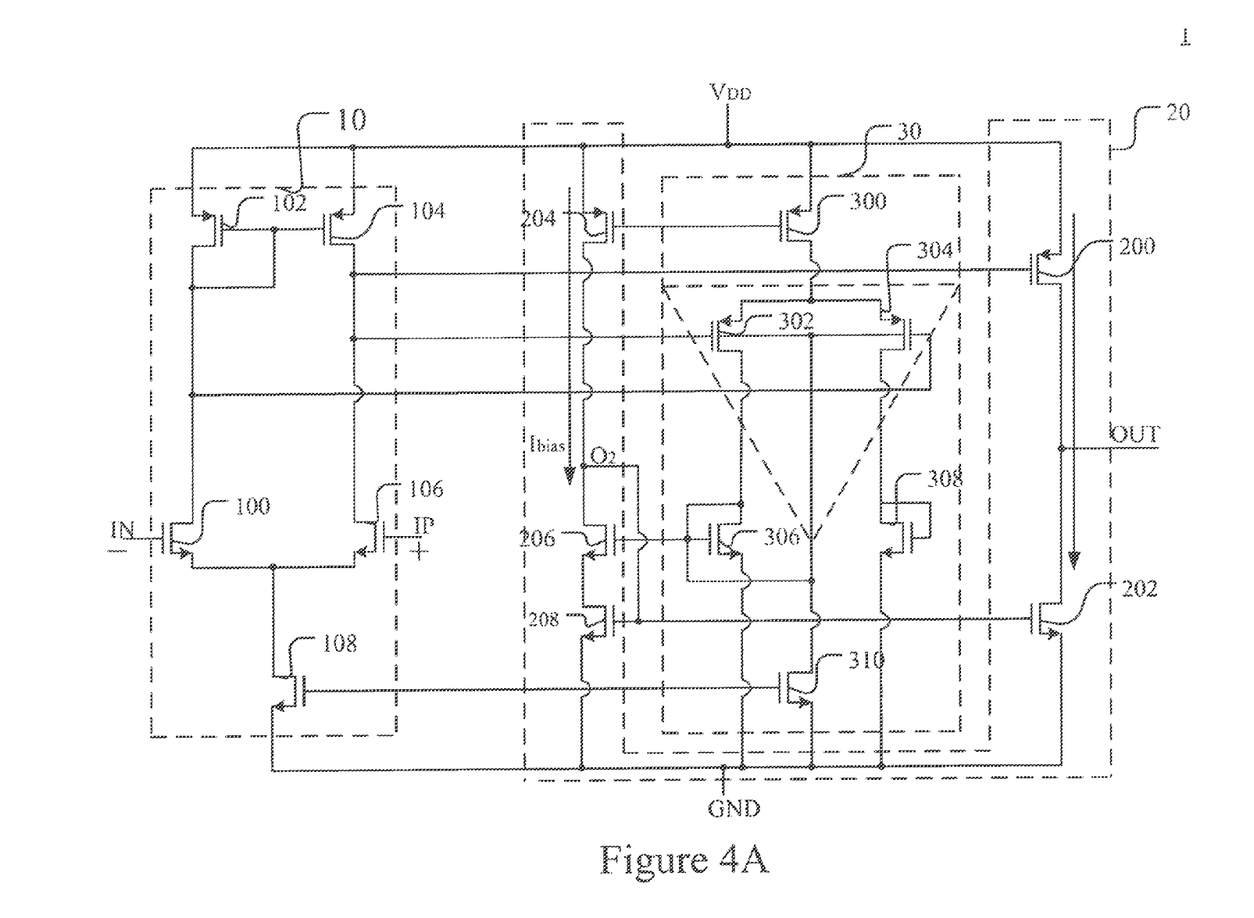
FIG. 4A shows an operating circuit diagram of the operational amplifier in FIG. 3 according an embodiment of the present invention.

FIG. 4A shows an operating circuit diagram of the operational amplifier according an embodiment of the present invention. As shown in the figure, the operational amplifier 1 according to the present invention is in the steady state, in which the output current of the output OUT of the operational amplifier 1 is:

$$I_{out} = \frac{1}{2} K_2 \left( \sqrt{\frac{2I_{bias}}{K_1}} + V_{t1} - V_{t2} \right)^2 \quad (1)$$

And the voltage at the node $O_2$ is:

$$O_2 = V_{GS} = \sqrt{\frac{2I_{bias}}{K_1}} + V_{t1} \quad (2)$$

where $K_1$ and $K_2$ are current parameters of the second current source 204 and the sixth transistor 202, respectively; $V_{t1}$ and $V_{t2}$ are the threshold voltages of the second current source 204 and the sixth transistor 202, respectively. Thereby, according to the above equations (1) and (2), it is known that according to the present invention, by controlling the areas of the second current source 204 and the sixth transistor 202, the output current $I_{out}$ will be related to the bias current $I_{bias}$. Accordingly, by adjusting the bias current $I_{bias}$, the output current $I_{out}$ can be limited.

Figure 4B:
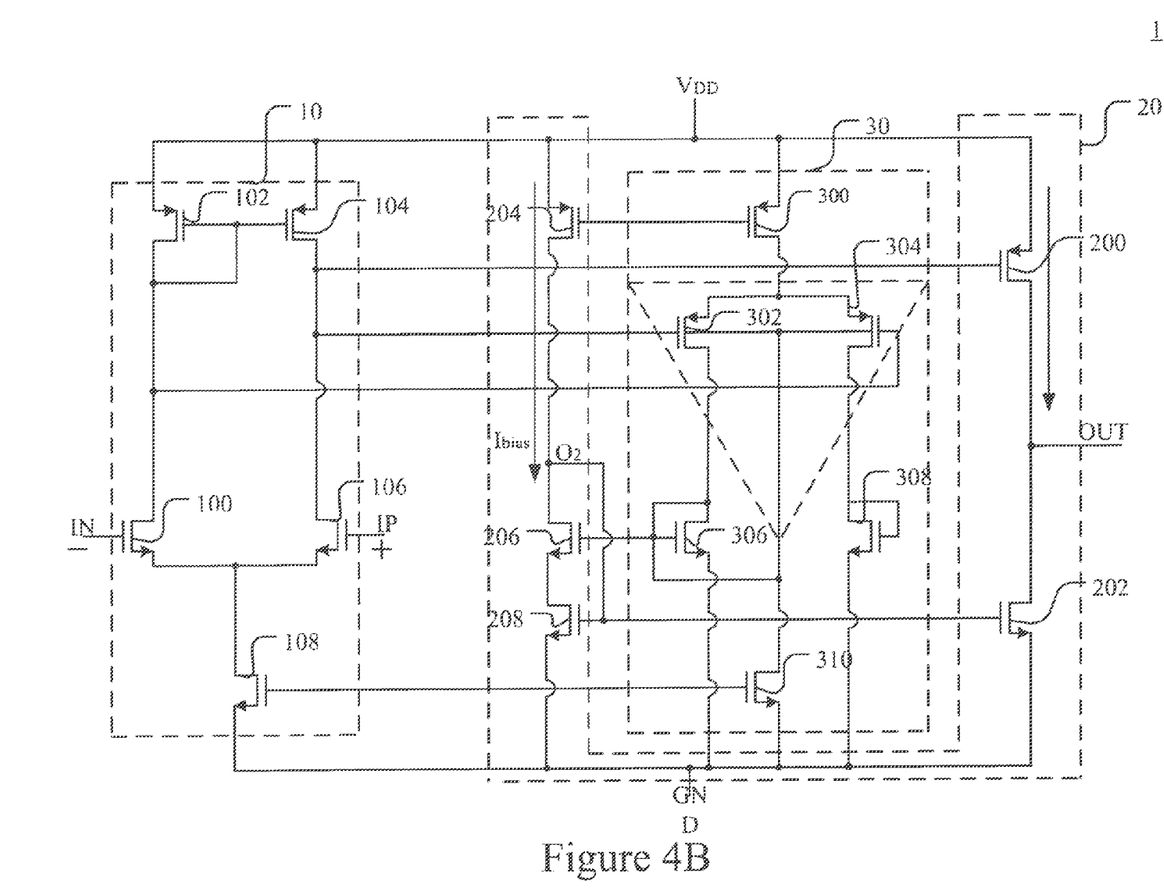
FIG. 4B shows an operating circuit diagram of the operational amplifier in FIG. 3 according another embodiment of the present invention.

FIG. 4B shows an operating circuit diagram of the operational amplifier according another embodiment of the present invention. As shown in the figure, the operation of the operational amplifier 1 according to the present embodiment is to drive high. In this operation, the differential circuit 10 will turn on the fifth transistor 200 while the floating bias generating circuit 30 will turn off the first control switch 206. Thereby, the output current $I_{out}$ will be produced at the power supply $V_{DD}$ and charge the load via the fifth transistor 200.

Figure 4C:
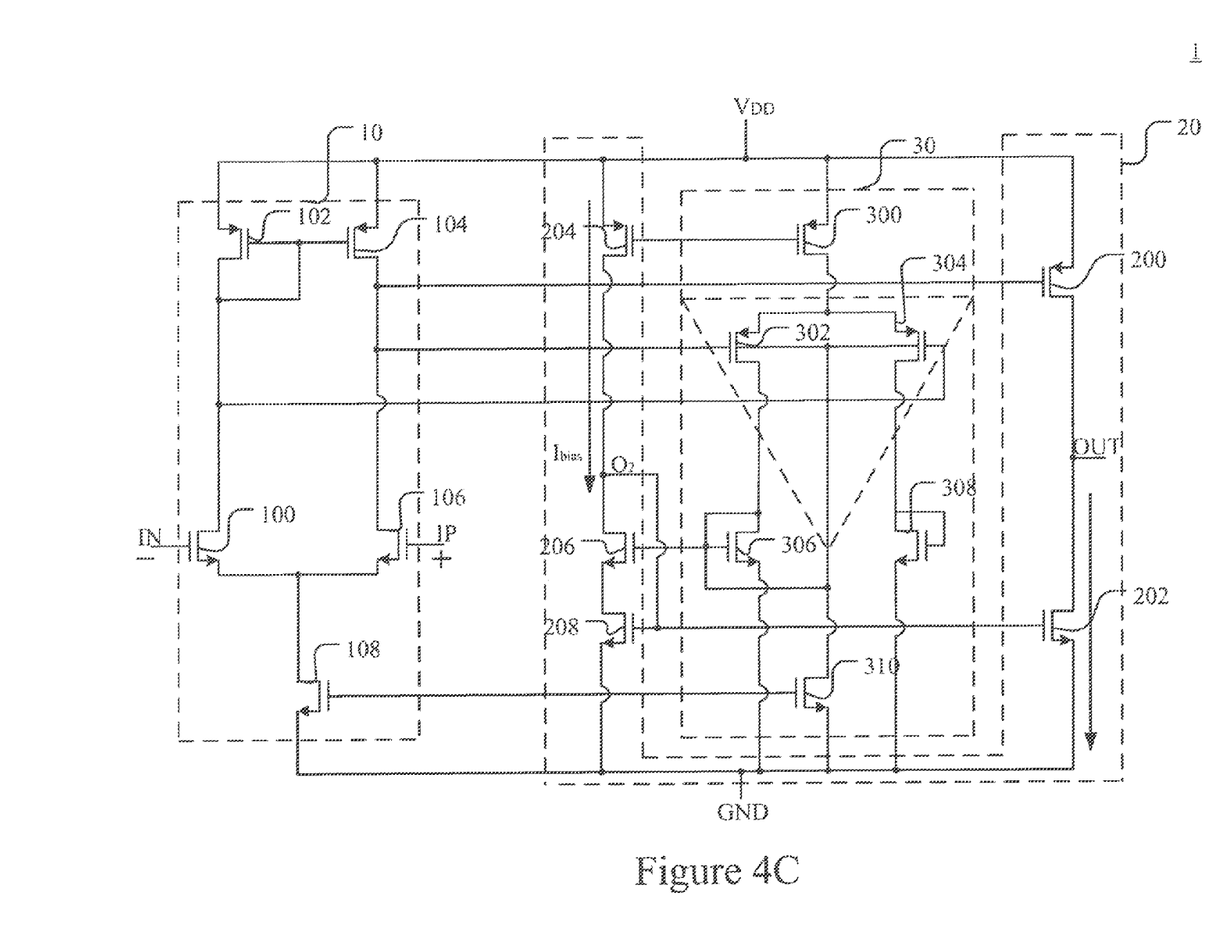
FIG. 4C shows an operating circuit diagram of the operational amplifier in FIG. 3 according another embodiment of the present invention.

FIG. 4C shows an operating circuit diagram of the operational amplifier in according another embodiment of the present invention. As shown in the figure, the operation of the operational amplifier 1 according to the present embodiment is to drive low. In this operation, the differential circuit 10 will turn off the fifth transistor 200 while the floating bias generating circuit 30 will turn on the first control switch 206. Thereby, the current-mirror circuit will mirror the bias current $I_{bias}$ and produce the output current $I_{out}$ at the sixth transistor 202 for discharging the load.

Figure 5:
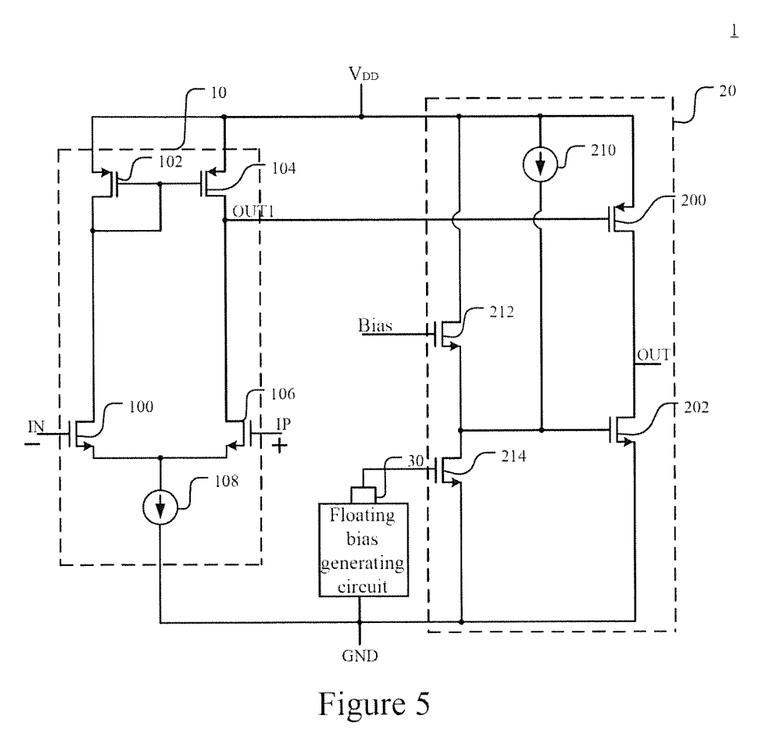
FIG. 5 shows a circuit diagram of the operational amplifier according to another embodiment of the present invention.
Figure 6:
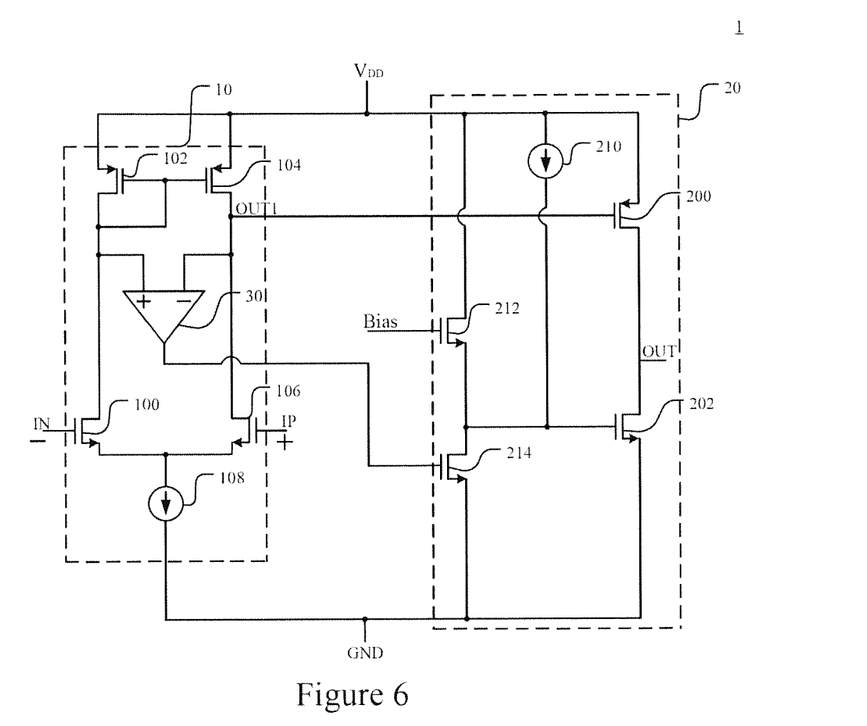
FIG. 6 shows a circuit diagram of the operational amplifier according to another embodiment of the present invention.

FIGS. 5 and 6 show circuit diagrams of the operational amplifier according to other embodiments of the present invention. As shown in the figures, the difference between the present embodiments and the one in FIG. 1 is that the output-stage circuits 20 of the operational amplifiers 1 according to the present embodiments comprise a fifth current source 210, a tenth transistor 212, and a second control switch 214, respectively. A terminal of the fifth current source 210 is coupled to the power supply $V_{DD}$ while the other terminal of the fifth current source 210 is coupled to the gate of the sixth transistor 202. A terminal of the tenth transistor 212 is coupled to the power supply $V_{DD}$ and a terminal of the fifth current source 210, while the other terminal of the tenth transistor 212 is coupled to a terminal of the fifth current source 210. In other words, the tenth transistor 212 and the fifth current source 210 are connected in parallel. In addition, the tenth transistor 212 is controlled by a bias. A terminal of the second control switch 214 is coupled to the sixth transistor 202 and the tenth transistor 212, while the other terminal of the second control switch 214 is coupled to the ground GND. Besides, the second control switch 214 is controlled by the floating bias generating circuit 30.

Figure 7A:
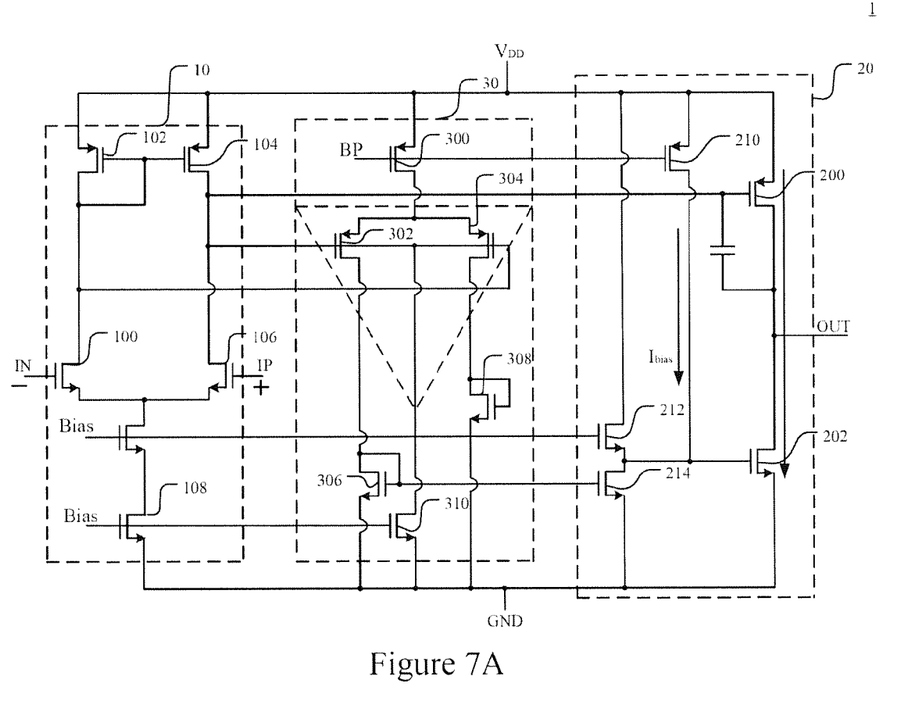
FIG. 7A shows an operating circuit diagram of the operational amplifier in FIG. 5 according an embodiment of the present invention.

FIG. 7A shows an operating circuit diagram of the operational amplifier in according an embodiment of the present invention. As shown in the figure, the operational amplifier 1 according to the present invention is in the steady state, in which the area of the tenth transistor 212 can limit the current produced by the fifth current source 210, and thus limiting the output current of the operational amplifier 1 according to the present embodiment.

Figure 7B:
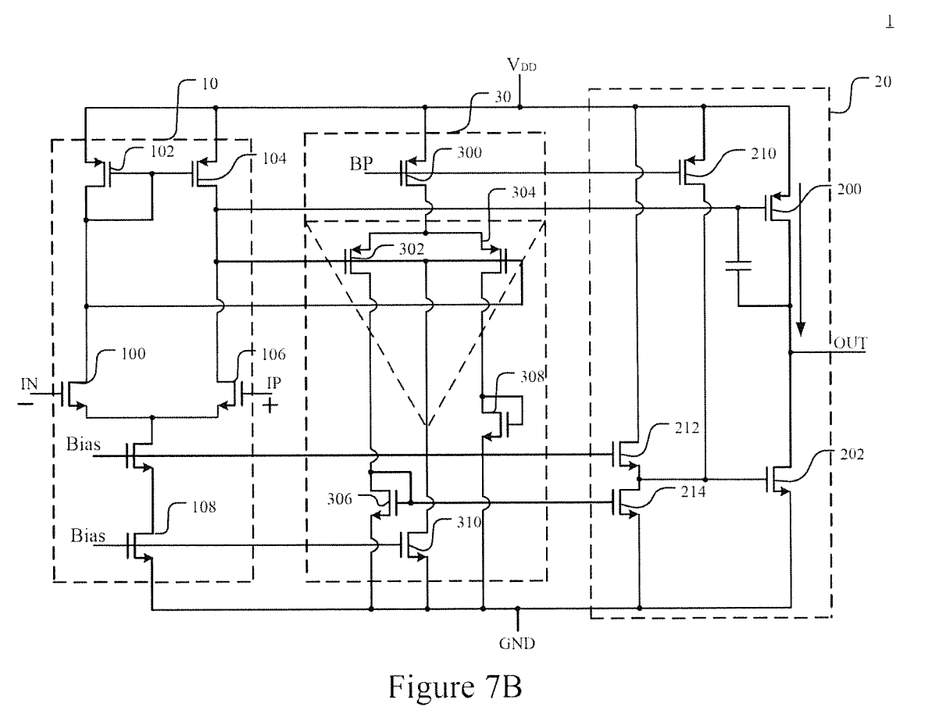
FIG. 7B shows an operating circuit diagram of the operational amplifier in FIG. 5 according another embodiment of the present invention.

FIG. 7B shows an operating circuit diagram of the operational amplifier in according another embodiment of the present invention. As shown in the figure, the operation of the operational amplifier 1 according to the present embodiment is to drive high. In this operation, the differential circuit 10 will turn on the fifth transistor 200 and the floating bias generating circuit 30 will turn on the second control switch 214. Thereby, the output current $I_{out}$ will be produced at the power supply $V_{DD}$ and charge the load via the fifth transistor 200.

Figure 7C:
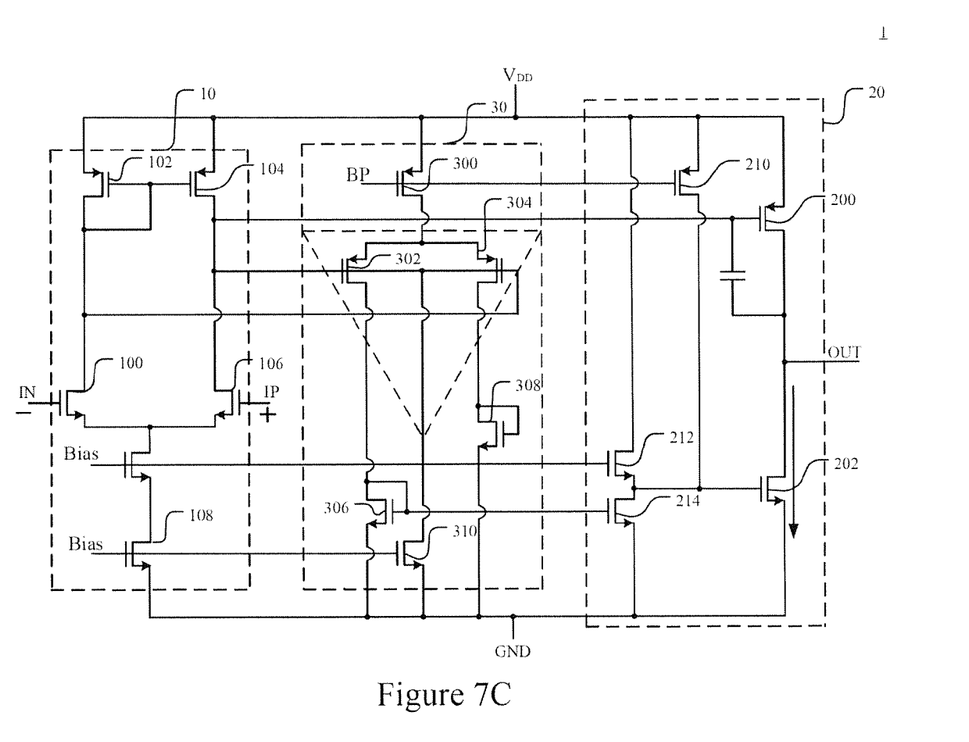
FIG. 7C shows an operating circuit diagram of the operational amplifier in FIG. 5 according another embodiment of the present invention.

FIG. 7C shows an operating circuit diagram of the operational amplifier in according another embodiment of the present invention. As shown in the figure, the operation of the operational amplifier 1 according to the present embodiment is to drive low. In this operation, the differential circuit 10 will turn off the fifth transistor 200 and the floating bias generating circuit 30 will turn off the second control switch 214, too. Thereby, the current produced by fifth current source 210 will flow past the sixth transistor 202 and discharge the load.

To sum up, the operational amplifier having low power consumption according to the present invention comprises a differential circuit, an output-stage circuit, and a floating bias generating circuit. The differential circuit receives an input signal and produces a control signal. The output-stage circuit is coupled to the differential circuit and produces an output signal according to the control signal. The floating bias generating circuit is coupled between the differential circuit and the output-stage circuit and generates a floating bias according to the control signal for controlling the rising or lowering of the voltage level of the output signal. Thereby, by using the floating bias generating circuit located between the differential circuit and the output-stage circuit, the floating voltage is generated according to the control signal for controlling the rising or lowering of the voltage level of the output signal of the output-stage circuit. Accordingly, the operational amplifier can charge and discharge rapidly, and thus extending the applications of the operational amplifier. Besides, the floating bias generating circuit can limit the output current while the operational amplifier is driving, and thus achieving the purpose of low power consumption.

Accordingly, the present invention conforms to the legal requirements owing to its novelty, nonobviousness, and utility. However, the foregoing description is only embodiments of the present invention, not used to limit the scope and range of the present invention. Those equivalent changes or modifications made according to the shape, structure, feature, or spirit described in the claims of the present invention are included in the appended claims of the present invention.

The invention claimed is:

1. An operational amplifier having low power consumption, comprising:
    a differential circuit, receiving an input signal, and producing a control signal;
    an output-stage circuit, coupled to said differential circuit, and producing an output signal according to said control signal; and
    a floating bias generating circuit, coupled between said differential circuit and said output-stage circuit, and producing a floating bias according to said control signal for controlling the rising or lowering of the voltage level of said output signal;
    wherein said floating bias generating circuit is an operational amplifying unit.

2. The operational amplifier of claim 1, wherein said output-stage circuit comprises:
    a first transistor, coupled to said differential circuit, and controlled by said control signal; and
    a second transistor, coupled to said first transistor and said floating bias generating circuit, and rising or lowering the voltage level of said output signal according to said floating bias.

3. The operational amplifier of claim 2, wherein said output-stage circuit further comprises:
    a current source, used for supplying a bias current; and
    a control switch, coupled to said current source, controlled by said floating bias, and said bias current controlling said second transistor for rising or lowering the voltage level of said output signal.

4. The operational amplifier of claim 1, wherein said operational amplifying unit comprises:
    a first current source, coupled to a power supply;
    a first transistor, having one terminal coupled to said first current source, and having the gate coupled to an output of said differential circuit; and
    a second transistor, having one terminal coupled to said first current source and said first transistor, and having the gate coupled to said differential circuit.

5. The operational amplifier of claim 4, wherein said operational amplifying unit further comprises a second current source, having one terminal coupled to the body of said first transistor and the body of said second transistor, and having the other terminal coupled to a ground.

6. The operational amplifier of claim 4, wherein said operational amplifying unit further comprises:
    a first diode, having one terminal coupled to the other terminal of said first transistor, and having the other terminal coupled to a ground; and
    a second diode, having one terminal coupled to the other terminal of said second transistor, and having the other terminal coupled to said ground.

7. The operational amplifier of claim 6, wherein said first diode and said second diode are field-effect transistors.

8. The operational amplifier of claim 1, wherein said differential circuit comprises:
    a first transistor, having the gate receiving said input signal;
    a second transistor, having one terminal coupled to said first transistor, having the other terminal couple to a power supply, and having the gate coupled to the drain;
    a third transistor, having a terminal coupled to the power supply, and having the gate coupled to the gate of said second transistor; and
    a fourth transistor, having one terminal coupled to said third transistor and an output of said differential circuit, and having the gate receiving said input signal; and
    a current source, having one terminal coupled to said first transistor and said fourth transistor, and having the other terminal coupled to a ground.

* * * * *